United States Patent [19]
Rietzel et al.

[11] Patent Number: 6,116,185
[45] Date of Patent: Sep. 12, 2000

[54] GAS INJECTOR FOR PLASMA ENHANCED CHEMICAL VAPOR DEPOSITION

[76] Inventors: James G. Rietzel, 4852 Sterling Hill Dr., Antioch, Calif. 94509; Christopher P. Woolley, 109 Clipper La., Martinez, Calif. 94553

[21] Appl. No.: 08/640,460

[22] Filed: May 1, 1996

[51] Int. Cl.[7] .................................................. C23C 16/00
[52] U.S. Cl. ................................. 118/723 R; 118/723 E; 118/718; 118/722; 118/723 MP; 156/272.2; 156/345; 204/298.07; 204/298.33
[58] Field of Search .................................. 118/715, 718, 118/722, 723 R, 723 MP, 723 E; 156/272.2, 345; 204/298.07, 298.33

[56] References Cited

U.S. PATENT DOCUMENTS

| | | | |
|---|---|---|---|
| 4,496,423 | 1/1985 | Walton | 156/345 |
| 4,512,283 | 4/1985 | Bonifield et al. | 118/723 |
| 4,745,337 | 5/1988 | Pichot et al. | 315/111.41 |
| 4,854,263 | 8/1989 | Chang et al. | 118/715 |
| 5,224,441 | 7/1993 | Felts et al. | 118/718 |
| 5,226,967 | 7/1993 | Chen et al. | 118/723 |
| 5,252,178 | 10/1993 | Moslehi | 156/643 |
| 5,266,153 | 11/1993 | Thomas | 156/643 |
| 5,314,539 | 5/1994 | Brown et al. | 118/718 |
| 5,536,914 | 7/1996 | Pelletier et al. | 219/121.48 |
| 5,653,811 | 8/1997 | Chan | 118/723 I |

OTHER PUBLICATIONS

Patent Abstracts of Japan, vol. 012, No. 168 (E–611), May 20, 1998, & JP 62 278734 A (Ulvac Corp), Dec. 3, 1987 *abstract*.

*Primary Examiner*—Dwayne C. Jones
*Assistant Examiner*—C. Delacroix-Muirheid

[57] ABSTRACT

The use of a gas injector including a dielectric material around the ports has an advantage when used with plasma enhanced chemical vapor deposition in that a plasma torch will not be formed at the gas injector and the gases will not dissociate prematurely. This adds to the quality of the coatings and allows the system to be used at higher amperage and thus improved line speeds. The use of a dielectric plug at the ports allows the ports to be easily serviced and replaced.

14 Claims, 2 Drawing Sheets

GAS INJECTOR FOR PLASMA ENHANCED CHEMICAL VAPOR DEPOSITION

BACKGROUND OF THE INVENTION

The present invention relates to a plasma-enhanced chemical vapor deposition process, especially the plasma-enhanced chemical vapor deposition process used to treat a web rolled through an evacuated chamber.

An example of such a process is described in Felts et al. U.S. Pat. No. 5,224,441, which is incorporated herein by reference. In this patent, gases, including a monomer (i.e., organosilicon), oxygen, and inert gas (i.e., helium), are introduced into the evacuated chamber. A glow discharge plasma is formed between two electrodes powered by an alternating current (AC) power supply. A web substrate flows over a drum electrode and is treated by the plasma so that a silicon oxide layer forms onto the web.

It is desired to run a plasma-enhanced chemical vapor deposition process at high currents to allow the substrate to be treated at high speeds, thus increasing productivity. The use of high currents can cause wrinkling or other damage to the web substrate.

It is desired to avoid these problems in the plasma enhanced chemical vapor deposition process.

SUMMARY OF THE INVENTION

The inventors have found that when gases for the system are injected through a typical gas injector at high currents of greater than about 45 amps, the gases can ignite into a plasma jet as soon as they enter the chamber. This ignited plasma can sometimes flow back into the gas supply, causing the early dissociation of the gases. This can cause a reduction in the quality in the deposited layer. Additionally, it was found that a plasma torch formed at the gas inlets can cause the sputtering of the metal material around the port, and thus erode the gas injection hole larger. Finally, it was found that the plasma jet from the gas injector sometimes contacted the web and caused wrinkling of the web and other heat damage.

The inventors found that this problem with the high current plasma enhanced deposition process can be avoided by the use of an improved gas injector having dielectric material around the gas outlet port. The use of dielectric material prevents a hollow anode effect from occurring at the gas injector. This prevents the gas from forming a plasma jet at the gas injector port. Additionally, the dielectric material eliminates the sputtering at the port.

In a preferred embodiment, plugs made of a dielectric material are fit into ports at the gas injector. These dielectric plugs have a center hole through which the gases are introduced into the evacuated chamber. The dielectric plugs fit securely into the ports of the gas injector so that the gases cannot flow around the plugs' edges. The plugs made of dielectric material are relatively inexpensive, removable in the case of irreparable damage, and changeable for plugs with a different-sized center hole if required for a different process.

Plugs without center holes can be used at some of the locations. This will effectively change the spacing of the gas supply holes which may be beneficial for certain processes.

The use of dielectric plugs also allows for metal material to be used for the remainder of the gas injector. The metal material is cheap compared to the dielectric material, and will also not be brittle like some ceramic materials.

Additionally, the center hole of the dielectric plugs are preferably less than 0.065 inches in diameter. In a preferred embodiment, the center hole is about 40 mil in diameter. This size of a hole prevents a plasma from flowing back through the port into the gas manifold. The gas injector can also be electrically isolated from the AC power supply. This also helps avoid the gases from forming a plasma jet as they enter the evacuated chamber.

The above steps help avoid a plasma jet from being formed. Additionally, by angling the gas supply ports so that they flow the gases out away from the web or drum, if a plasma torch is formed at the gas supply, it does not cause heat damage to the web. Additionally, a faceplate can be used to cover the center holes in the direction between the drum with the web and the holes. The faceplate allows repair personnel to walk on the gas injector without worrying about damaging or clogging the center holes of the gas injector.

Alternately, the entire gas injector can be coated or made of a dielectric material to prevent the gases from torching up at the gas injector.

The present invention also involves a method of treating a substrate including forming a plasma in an evacuable chamber, supplying gases for the plasma into an evacuable chamber through the gas injector, the gas injector having gas ports including plugs made of a dielectric material, the plugs having a center hole through which the gases enter into the evacuable chamber. The gas supplying step is such that the gas does not leak around the sides of the plug into the evacuable chamber. The invention also concerns a method which includes placing a substrate into the evacuable chamber and treating it with the plasma.

DETAILED DESCRIPTION OF THE DRAWINGS

Figure 1:
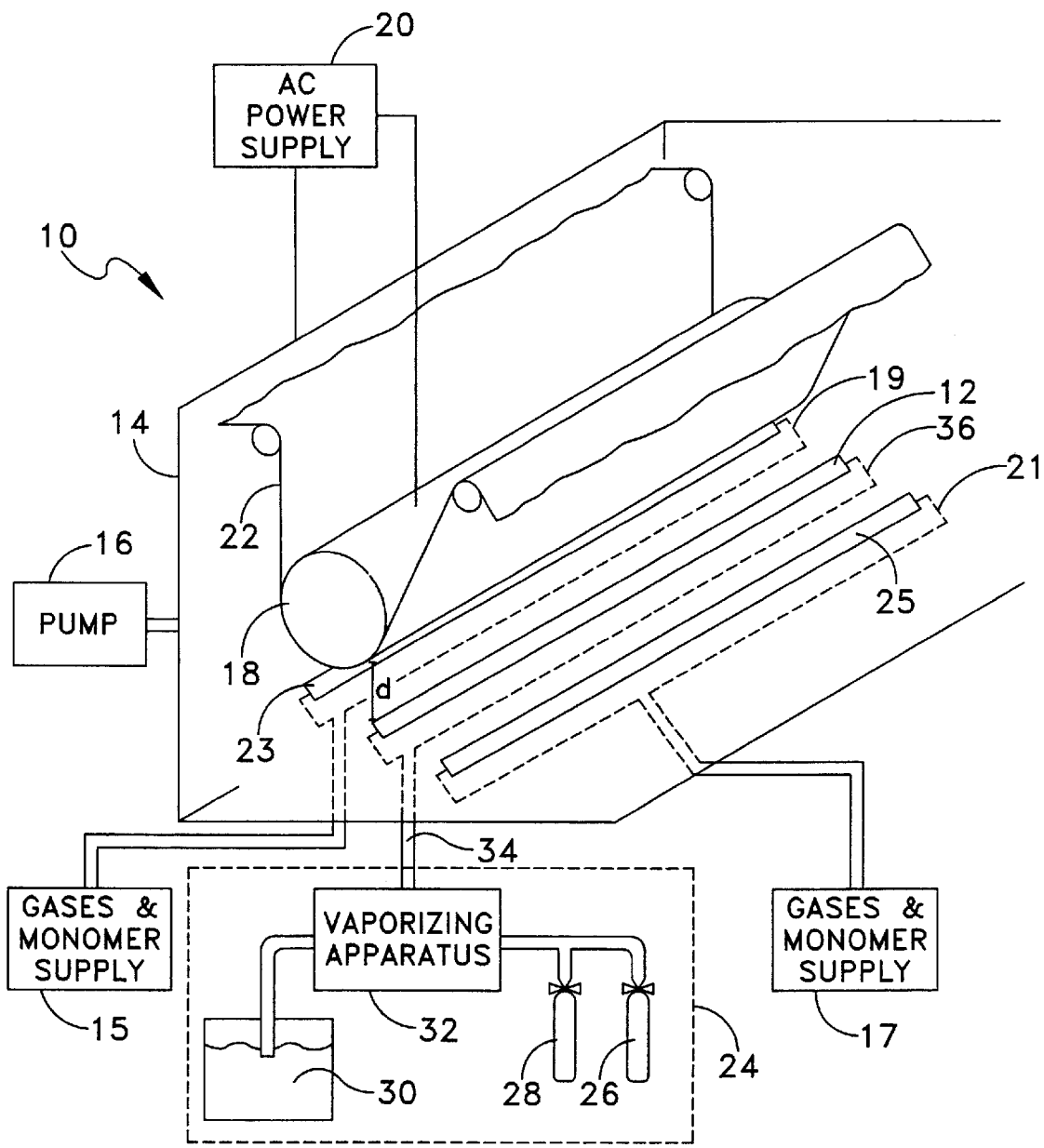
FIG. 1 is a diagram of a plasma enhanced chemical vapor deposition system showing the position of the gas injector of the present invention.

FIG. 1 is a diagram of a plasma enhanced vapor deposition system 10 showing the position of the gas injector 12. The plasma enhanced vapor deposition system 10 includes an evacuable chamber 14. A pump 16 is used to maintain the gas pressure within the evacuable chamber 14 at the desired level. A drum 18 is used as one of the electrodes of the system, and is attached to an AC power supply 20. An AC power supply from Advanced Energy can be used as the AC power supply 20. A web substrate material 22 flows around the drum 18, which rotates so that a new section of the web 22 can be treated as the web rolls by. A plasma is formed around the drum 18 to treat the web. In the preferred embodiment, a silicon oxide (SiOx) coating is formed on the web material. The plasma causes the dissociation of the monomer material and helps remove impurities from the web coating.

Not shown in this figure are magnets and baffles which can be used to arrange the plasma around the web material 22. A gas supply 24 is used to supply gas to the plasma enhanced chemical vapor deposition system 10. This gas supply 24, in a preferred embodiment, includes a noble gas supply 26 which can be used to supply helium, an oxygen supply 28, a supply of the liquid monomer 30, and a vaporizing apparatus 32. A heated stainless steel (SST) line 34 is used to supply the gases to a manifold 36 shown in phantom below the evacuated chamber 14.

The manifold 36 holds the gases until they flow into the evacuated chamber 14 through the gas injector 12. The details of the gas injector 12 are best shown with respect to FIG. 2. Looking again at FIG. 1, in a preferred embodiment, there are two additional gas and monomer supplies 15 and 17, two additional manifolds 19 and 21, and two additional gas injectors 23 and 25. Thus, a total of three gas and monomer supply zones are provided in the chamber.

Figure 2:
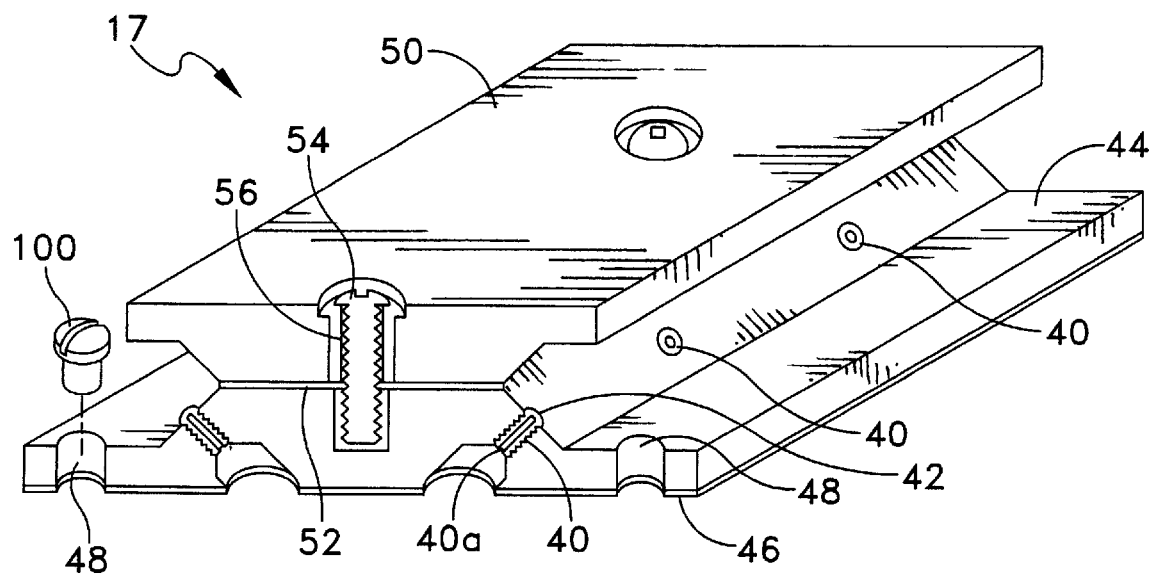
FIG. 2 is a cross-sectional view of the gas injector of the present invention.

FIG. 2 is a cross-sectional view of the gas injector 12' of the present invention. In the preferred embodiment, dielectric plugs 40 are used. The dielectric plugs 40 include a center hole 40a, which preferably has a diameter of less than about 0.065 inches. In a preferred embodiment, the diameter of the center hole is about 40 mils. The small diameter of the center hole 40a prevents any plasma from moving back through into the gas manifold and causing premature dissociation of the gases. In the preferred embodiment, the dielectric plug 40 is made of a fluorogold material. Fluorogold is a ceramic/Teflon alloy available from FURON. This material is easy to work but is more expensive than aluminum or other common metals. For this reason, it is less expensive to form only the plugs out of the fluorogold material rather than the entire gas injector. It is important that the dielectric plugs are securely fashioned into the port 42 so that no gases leak around the edges of the dielectric plugs. The plugs are preferably 1/16 NPT fluorogold pipe plugs with Allen head inserts and 40 mil holes drilled through them. In a preferred embodiment, the plugs are positioned about 1 per inch along the gas injector.

The gas plugs 40 can be easily removed in case of clogging or other damage, and a replacement plug fitted into the gas port. Additionally, if the process is to be changed such that another size center hole is required, alternate dielectric plugs can be fitted into the gas injector. In the preferred embodiment, the main metal piece 44 of the gas injector 12' is made of aluminum. Aluminum is light, cheap, and provides good support for the gas injector. If the gas injector is made of a conductive material, the gas injector should be electrically isolated from the chamber by the use of a dielectric materials located at 100 and 46. A silicon rubber gasket 46 also prevents the gases from leaking around the edges of the gas injector into the evacuated chamber. The gas injector 44 can be screwed down onto the evacuated chamber through the screw holes 48. Screws with a dielectric coating or shell can be used to help maintain the electrical isolation of the gas injector 12' from the chamber. A dielectric shell is preferred because coatings can be chipped or pulled off. The electrical isolation of the chamber from the gas injector 12' is especially important when the chamber walls are being used as one of the electrodes of the AC plasma system. Maintaining the electrical isolation of the gas injector 12' can help avoid the plasma torch from forming right as the gases are injected into the evacuable chamber. Note that, in the preferred embodiment, the holes 40a in the dielectric plugs 40 are arranged at a 45° angle. By angling the gas as it is injected into the evacuable chamber away from the web or drum, if a plasma torch is formed from the gases as they enter the evacuable chamber, they will not contact the web or drum. Looking at FIG. 1, this is relevant because the distance, d, between the drum 18 and the gas injector 12 is about one and one-half inches in a preferred embodiment.

A faceplate 50 is attached to the metal piece 44. The faceplate 50 extends between the ports 48 and the drum electrode so as to prevent dielectric material produced by the system from clogging the holes. In the preferred embodiment, the faceplate 50 is partially isolated from the metal piece 44 by a dielectric material, such as an aluminum oxide tape 52. Screws 54 with a dielectric coating 56 are used to connect the faceplate 50 with the metal piece 44. The faceplate 50 also allows for people to walk on top of the gas injector without clogging the holes in the dielectric plugs.

In a preferred embodiment, the gas injector 12' is four inches wide, one inch tall, and 71 inches long. In this preferred embodiment, sixty-six pairs of dielectric plugs with center holes of forty mils in diameter are provided.

Alternately, the entire gas injector can be made of a dielectric material or of a material which is coated by a dielectric material. This alternative is more expensive and, if the gas injector were to be made of a ceramic material, it could have problems due to the brittleness of the material.

An example of a process used with the system of FIG. 1 is given below.

| Gas | Zone#1 | Zone#2 | Zone#3 | Total |
| --- | --- | --- | --- | --- |
| monomer | 1.0 slm | 1.6 slm | 1.0 slm | 3.6 slm |
| oxygen | 3.0 slm | 4.0 slm | 3.0 slm | 10.0 slm |
| helium | 3.0 slm | 4.0 slm | 3.0 slm | 10.0 slm |

The table gives the gas supply values, wherein "slm" is standard liter(s) per minute. The three zones are the gas and monomer supply zones defined by the three gas injectors. The power is about 30.0 KW, current is about 58.0 amps, and voltage at about 515 volts RMS. The web speed is about 100 m/min and the deposition rate about 133 angstroms per second.

Although several preferred embodiments of this invention have been described in detail herein with reference to the accompanying drawings, it is to be understood that the invention is not limited to these precise embodiments, and that various changes and modifications may be effected therein by one skilled in the art without departing from the scope or spirit of the invention as defined in the appended claims.

What is claimed is:

1. A plasma treating apparatus comprising:
   an evacuable chamber;
   a power source connected to two electrodes in the evacuable chamber for forming a plasma therein for treating a substrate therein;
   a gas supply for supplying plasma-forming gas to a gas injector, the gas injector including at least one gas port for allowing gas to enter the evacuable chamber, the gas port including a plug made of a dielectric material, the plug having a center hole through which the gas passes into the evacuable chamber, and the plug fitted securely into the gas injector so that gas does not leak around the plug into the evacuable chamber.

2. The apparatus of claim 1, wherein the dielectric plug is removable.

3. The apparatus of claim 1, wherein the gas injector is electrically isolated from the power source.

4. The apparatus of claim 1, wherein a size of the center hole is less than 0.065 inch.

5. The apparatus of claim 1, wherein the gas injector is part of the evacuable chamber.

6. The apparatus of claim 1, wherein the gas injector is such that the center hole of the plug is angled away from a portion of the substrate closest thereto.

7. The apparatus of claim 1, wherein the gas injector includes a faceplate positioned over the center hole in the plug.

8. The apparatus of claim 7, wherein the faceplate is of a construction sufficient to support human ambulatory activity thereon.

9. The apparatus of claim 1, wherein the power source is an alternating current power supply.

10. The apparatus of claim 1, wherein the gas injector, excluding the plug, is made of metal.

11. A method of treating a substrate comprising:

forming a plasma in an evacuable chamber;

supplying gas for the plasma into the evacuable chamber through a gas injector, the gas injector with at least one gas port including a plug made of a dielectric material, the plug having a center hole through which the gas enters into the evacuable chamber, wherein gas does not leak around the plug into the evacuable chamber; and placing a substrate in the evacuable chamber and treating it with the plasma.

12. The method of claim 11, further comprising replacing the dielectric plug.

13. The method of claim 11, further comprising replacing the dielectric plug having a center hole of a first size with another dielectric plug having a center hole of a size other than the first size.

14. The method of claim 11, wherein the gas supplying is such that the gas is angled away from a portion of the substrate closest thereto.

* * * * *